（12）United States Patent
Born et al.

(10) Patent No.: US 6,330,207 B1
(45) Date of Patent: Dec. 11, 2001

(54) TIMEPIECE INCLUDING A MAGNETIC OR CAPACITIVE DEVICE FOR DETECTING AT LEAST ONE REFERENCE ANGULAR POSITION OF A WHEEL OF SAID TIMEPIECE

(75) Inventors: Jean-Jacques Born, Morges; Pierre-André Farine, Neuchâtel; Philippe Passeraub, Oberrief, all of (CH)

(73) Assignee: Asulab S.A., Bienne (CH)

( * ) Notice: Subject to any disclaimer, the term of this patent is extended or adjusted under 35 U.S.C. 154(b) by 0 days.

(21) Appl. No.: 09/296,130

(22) Filed: Apr. 22, 1999

(30) Foreign Application Priority Data

Apr. 24, 1998 (CH) .................................................. 0937/98

(51) Int. Cl.⁷ ............................. G04B 19/00; G04B 19/04
(52) U.S. Cl. ................................. 368/76; 368/47; 368/80; 368/181; 368/250
(58) Field of Search ....................... 368/10, 47, 185–187, 368/272, 273, 72–74, 250, 76, 80, 181

(56) References Cited

U.S. PATENT DOCUMENTS

| | | | |
|---|---|---|---|
| 3,815,351 | * | 6/1974 | Vovelle ................................. 368/250 |
| 4,084,403 | * | 4/1978 | Kitai et al. .............................. 368/80 |
| 4,196,579 | * | 4/1980 | Schaefer ................................. 368/181 |
| 4,645,357 | * | 2/1987 | Allgaier et al. ....................... 368/187 |
| 5,202,858 | * | 4/1993 | Kanzaki ................................. 368/80 |
| 5,222,053 | * | 6/1993 | Ohhira ................................... 368/80 |
| 5,245,591 | * | 9/1993 | Katou .................................... 368/80 |
| 5,270,993 | * | 12/1993 | Besson et al. ........................ 368/80 |
| 5,465,239 | * | 11/1995 | Koch ...................................... 368/80 |
| 5,898,644 | * | 4/1999 | Ganter et al. .......................... 368/47 |
| 6,038,523 | * | 3/2000 | Akahane et al. ....................... 368/74 |

FOREIGN PATENT DOCUMENTS

| | | |
|---|---|---|
| 38 28 810 | 3/1990 | (DE) . |
| 1 512 207 | 4/1968 | (FR) . |
| 97 45 705 | 12/1997 | (WO) . |

* cited by examiner

*Primary Examiner*—Andrew H. Hirshfeld
*Assistant Examiner*—Jeanne-Marguerite Goodwin
(74) *Attorney, Agent, or Firm*—Sughrue, Mion, Zinn, Macpeak & Seas, PLLC (57) ABSTRACT

Timepiece including a clockwork movement (2) provided with an analogue display (14). The wheel (4) includes a plate (8) with a toothing (6) defined by its external edge and a shaft (10). A device for detecting the angular position of the wheel (4) includes a magnetic or capacitive sensor (20) whose detection element, in particular a flat spiral coil (24), is used for detecting a variation in presence of the material, in particular a non magnetic conductive metal, forming the plate (8). The plate has at least one opening (16) situated in the intermediate region thereof between a central hole (18), and the tooth (6). The opening (16) defines a reference geometric semi-axis of the wheel (4) whose angular position is determined by the detection device provided.

12 Claims, 6 Drawing Sheets

TIMEPIECE INCLUDING A MAGNETIC OR CAPACITIVE DEVICE FOR DETECTING AT LEAST ONE REFERENCE ANGULAR POSITION OF A WHEEL OF SAID TIMEPIECE

BACKGROUND OF THE INVENTION

The present invention concerns a timepiece including a clockwork movement, provided with an analogue display and at least one wheel and pinion fixed in rotation to a rotating indicator or display means of said analogue display, and a device for detecting, at least one reference angular position of said wheel and pinion, this detection device including a magnetic or capacitive sensor.

More particularly, the invention concerns a device for detecting at least one reference angular position of a toothed wheel of the gear train of a clockwork movement.

Those skilled in the art know optical devices for detecting at least one reference angular wheel position belonging to a gear train of a clockwork movement. All these optical detection devices are relatively complex. They require a light source and a light receiver at a distance from said source. The mounting operations of an optical detection device are often difficult given the precise adjustment necessary between the light source, the receiver and the wheel or wheels associated with this device. Within the scope of the present invention, it is therefore proposed to avoid any optical system for detecting the position of a wheel in a clockwork movement.

A system for detecting the position of coaxial wheels respectively associated with coaxial hands of a clockwork movement is known from the English abstract of International Patent Application No. WO 97/45705 (corresponding to U.S. Pat. No. 6,038,523—Akahane et al). On each solid or full toothed wheel are arranged several discrete portions of a hard thin magnetic film which define an identification pattern for a contactless magnetic sensor. Each of the wheels whose the angular position is able to be detected is associated with its own magnetic sensor. The amplitude of the signal detected by these magnetic sensors varies according to whether they are situated in front of segment of magnetic material or not, as is shown in FIGS. 3 and 4 of this International Patent Application. The detection system proposed in this document is disadvantageous because each wheel associated with a magnetic sensor has to be provided with distinct segments or portions of a solid film made of magnetic material arranged on one face of the toothed wheel. The manufacturing cost of the wheels is thus increased and the arrangement of the identification pattern is provided on a solid or full plate of the toothed wheel, which can be inconvenient for the working of the clockwork movement. The plates of the wheels are thus formed of at least two different materials, namely the material forming the base of the plate of the wheel and the magnetic material arranged at the surface of the base.

SUMMARY OF THE INVENTION

One object of the present invention is to overcome the aforementioned drawbacks by providing a timepiece including a contactless device for detecting the angular position of at least one reference semi-axis of a wheel which is of simple construction and which involves minimum complication of the clockwork movement.

The present invention therefore concerns a timepiece including:

- a clockwork movement provided with an analogue display and including at least one wheel fixed in rotation to a rotating indicator of analogue display, this wheel including a plate with a toothing defined by its external edge and a shaft perpendicular to said plate;
- a device for detecting the angular position of at least one reference geometric semi-axis of said wheel, this device including a magnetic or capacitive sensor provided with a detection element;

said plate of the wheel being formed by a material a variation in whose presence above or below the detection element of the sensor generates a variation in at least one parameter or one variable of said sensor on which a measuring signal provided by the latter depends. Said plate has at least one opening situated in the intermediate region thereof between a central hole, provided for the passage of said shaft, and said toothing. This opening is used to define said at least one reference geometric semi-axis. The sensor is arranged in relation to the wheel so that its detection element is at least partially above or below said opening in at least one given angular position of said wheel.

As a result of the aforementioned features of the invention, the wheel associated with the contactless sensor can have a plate formed of a single material, conventional for wheels of a clockwork movement, in particular an electrically conductive metal such as brass.

The plate of the wheel associated with the detection device does not have to be formed of a permanently magnetised material, nor to carry magnetised elements with the selected type of contactless sensor.

As will be understood better with reference to the description hereinafter, the invention allows at least one reference geometrical semi-axis of a wheel formed in a conventional manner with appropriate machining of the plate of such wheel, in particular of said at least one opening.

By way of example for the electronic circuit of the magnetic or capacitive sensor provided within the scope of the present invention, reference will be made to European Patent No. 0746100 which discloses an inductive or capacitive proximity sensor and which is incorporated by reference into the present description.

According to a particular embodiment of the invention, the reference geometric semi-axis of the wheel starts perpendicularly from time geometric axis of rotation of said wheel and passes through the geometric centre of said opening.

Thus, a single opening provided in the plate of the wheel allows the detection device according to the invention to determine the angular position of the wheel. Machining of an opening in a wheel plate is a very cheap operation, which is moreover, already provided in certain wheels in order to limit the weight of the wheel and also the cost of materials. Thus, the present invention does not generate any complication for the conventional clockwork movement to allow detection of the angular position of a wheel.

According to another particular embodiment, the plate of said wheel associated with the detection device has, in its intermediate region, at least one opening and a radial arm, the median direction of this arm defining a reference geometric semi-axis of the wheel whose angular position can be detected by the detection device according to the invention.

Thus, within the scope of the present invention, the angular position of a wheel can be determined by a radial and median direction of an opening or an arm, in particular in the shape of an annular section. Moreover, as will be described hereinafter, it is also possible in the case of the present invention to define a reference geometric semi-axis of a wheel by a transition between an opening and a material portion of the plate of said wheel, the type of sensor provided in a preferred embodiment of the present invention allowing detection of such a transition when this transition allows a particular radial direction of the wheel to be defined.

BRIEF DESCRIPTION OF THE DRAWINGS

The present invention will be described in more detail with the aid of the following description, given with reference to the annexed drawings, given by way of non-limiting examples and in which.

DETAILED DESCRIPTION OF THE INVENTION

The embodiments described hereinafter all include an inductive sensor given that the developments and prototypes made within the scope of the present invention were effected with an newly developed integrated inductive sensor. The results obtained with this integrated inductive sensor including a single flat spiral coil of small dimensions are very good. However, an integrated sensor of the capacitive type can also be provided instead of an inductive sensor. It will be noted however, that the inductive sensor is less sensitive to the environment and to disturbances caused by manufacturing and assembly tolerances than a capacitive sensor.

Figure 1:
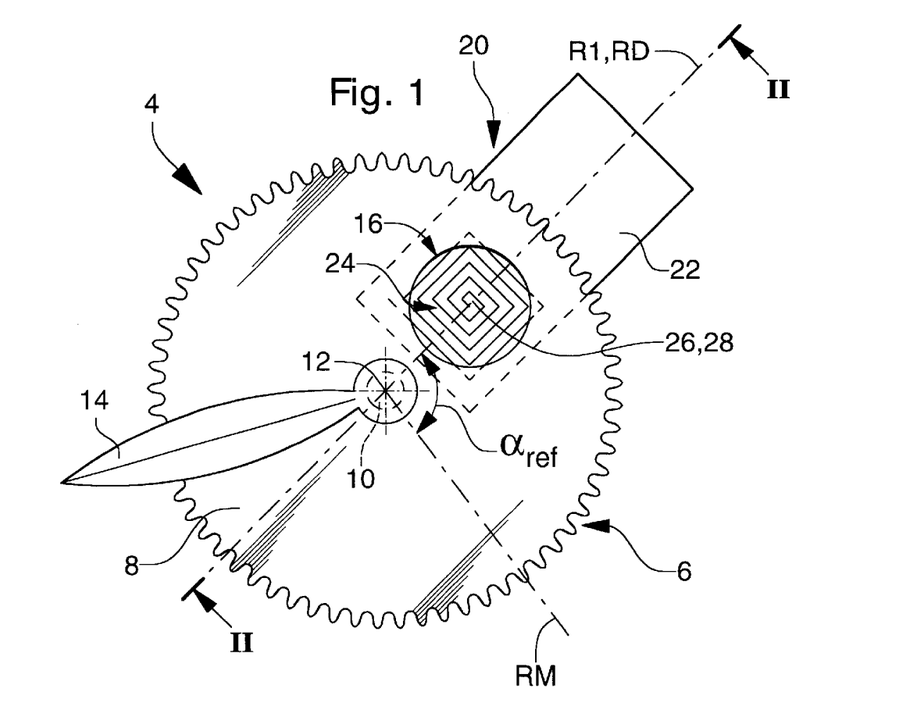
FIG. 1 shows a toothed wheel of a clockwork movement associated with an inductive sensor for detecting a reference geometric semi-axis of said wheel.
Figure 2:
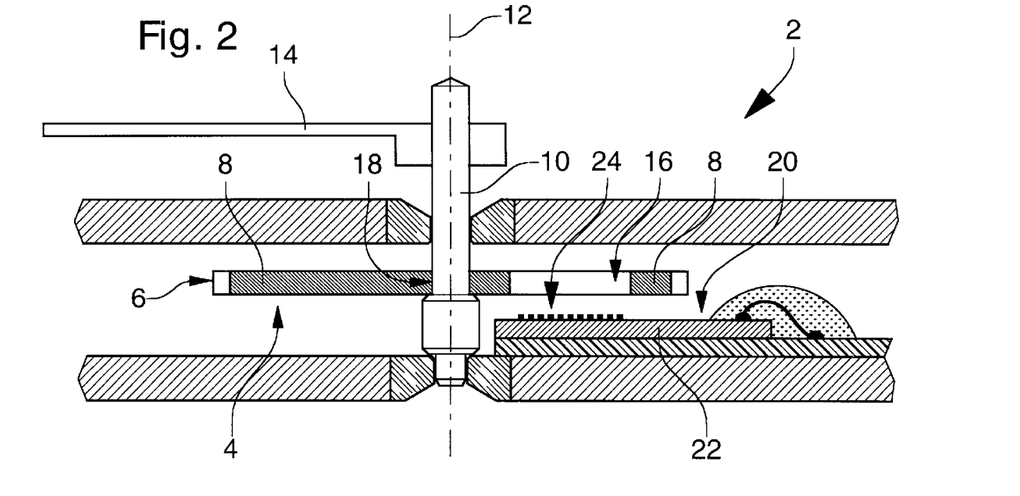
FIG. 2 is a schematic cross-section partially showing a clockwork movement including the toothed wheel and the inductive sensor shown in FIG. 1.
Figure 3:
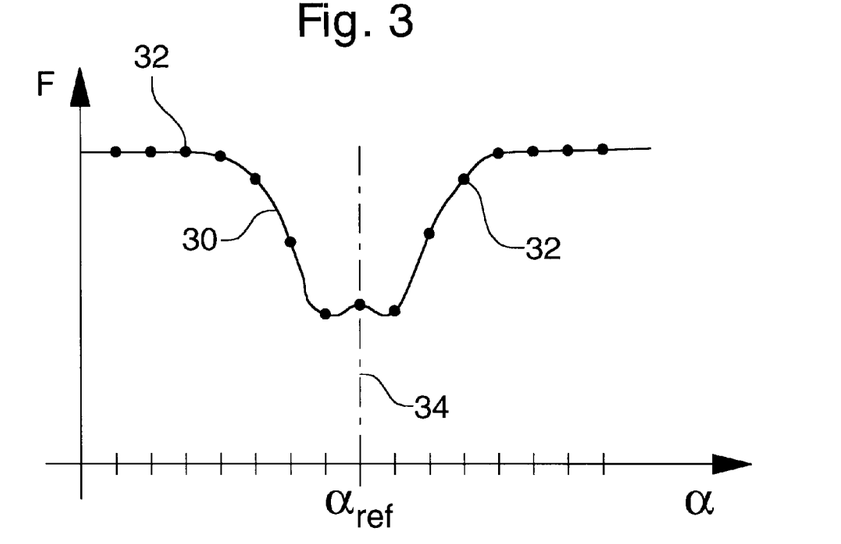
FIG. 3 shows schematically a curve formed using measurements taken by the inductive sensor shown in FIGS. 1 and 2, this curve allowing the reference semi-axis of the wheel shown in FIGS. 1 and 2 to be determined.

With reference to FIGS. 1 to 3, a first embodiment of the invention will be described hereinafter. The clockwork movement 2 includes a toothed wheel 4 with a toothing 6 defined by the external edge of the plate 8. Wheel 4 also includes a shaft 10 defining a geometric axis of rotation 12. Clockwork movement 2 is associated with an analogue display including a rotating indicator 14 fixedly mounted on shaft 10. Indicator 14 can be used to indicate the hour, the minute, the second or any other useful information provided for an analogue display. Plate 8 is fixedly mounted onto shaft 10 so that indicator 14 is fixed to plate 8.

Plate 8 has a circular opening 16 in its intermediate region, i.e. between the central hole 18 provided for the passage of shaft 10 and toothing 6. An inductive (i.e magnetic) demagnetic sensor 20, formed of an integrated circuit 22 and a flat spiral coil 24 arranged on one face of the integrated, circuit is arranged in relation to plate 8 of wheel 4 so that flat coil 24 is at least partially underneath opening 16 in at least one given angular position of wheel 4, as shown in FIG. 1.

It will be noted that sensor 20 can, likewise, be arranged above plate 8 so that flat coil 24 is at least partially situated facing opening 16 in at least one given angular position of wheel 4. Preferably, central magnetic axis 26 of the spiral forming flat coil 24 passes substantially through the centre 28 of opening 16 in a given angular position taken by wheel 4, as shown in FIG. 1. The reference angle $\alpha_{ref}$ is defined between a reference direction RM of the clockwork movement and the reference geometric semi-axis RD of sensor 20, parallel to plate 8, which starts from geometric axis 12 and intersects central magnetic axis 26 of coil 24. The reference geometric semi-axis R1 of wheel 4 starts from geometric axis 12 and passes through the centre 28 of circular opening 16. In FIG. 1, semi-axes R1 and RD are identical.

It will be noted that indicator 14 can have any angular offset in relation to the direction of semi-axis R1.

FIG. 3 shows schematically a graph 30 defined by measurement points 32 obtained by sensor 20. According to the invention, plate 8 is formed by a non-magnetised material, i.e. it is not formed by a permanent magnet, but by a material a variation in whose proximity relative to flat coil 24 generates a variation in at least one parameter or variable of sensor 20 on which a measurement signal provided by such sensor depends. The inductive sensor provided in this embodiment includes an electronic circuit similar to that described in European Patent No. 0746100, this sensor defining a differential relaxation oscillator. This measurement signal provided by sensor 20 is representative of a frequency determined by the electronic circuit of the sensor, this frequency varying as a function of the variation in presence of the material constituting pate 8 above or below the detection element defined by coil 24. The variation in said frequency results from the variation in value of the inductance of coil 24 within the electronic circuit of sensor 20. When coil 24 is situated substantially facing non magnetised material forming plate 8, the frequency is high. Reversely when coil 24 is situated facing opening 16 machined in plate 8, the frequency is low. Curve 30 defines schematically the evolution in value of the frequency generated by the sensor as a function of the angular position of the reference semi-axis R1 of wheel 4 which, as stated previously, starts from geometric axis 12 and passes through centre 28 of circular opening 16.

It will be noted that curve 30 is substantially symmetrical relative to axis 34 corresponding to the value $\alpha = \alpha_{ref}$. Thus, using an appropriate analysis of the evolution in measurement points 32 as a function of the angular position a of semi-axis R1 of wheel 4, it is possible to determine which measurement corresponds to the angular position $\alpha = \alpha_{ref}$ of semi-axis R1, i.e. when the latter is substantially parallel to reference semi-axis RD of sensor 20 which is fixed relative to the clockwork movement.

It will be noted that graph 30 can have a peak instead of a trough following the making of the electronic circuit provided or the material constituting plate 8. With the inductive sensor proposed here by way of non limiting example; the material of plate 8 is either an electrically conductive metal, or a material of high magnetic permeability. Preferably the material selected is a conductive metal having a magnetic permeability equal to 1 or close to 1, i.e. a non ferromagnetic metal such as aluminum or brass widely used for manufacturing wheels and other parts for clockwork movements.

It will be noted that the width of the peak or trough in graph 30 is a function of the angular dimension of the reference opening or, as will be described hereinafter, of the reference radial arm. It is possible to provide a small angular dimension for this opening (a slit) or radial arm and/or a low measurement frequency and/or a stepping drive defining sufficiently significant angular jumps or steps for a single measurement point essentially to define the peak or the trough. In such case, it is sufficient to detect when a measurement gives a frequency value lower, or respectively higher than a threshold value to detect the passing of the slit, or respectively the peak (or vice versa according to the type of sensor 20 provided). Such a measurement thus corresponds to an angular position $\alpha$ of semi-axis R1 equal to $\alpha_{ref}$. Consequently, the angular position of the wheel is directly determined when reference semi-axes RD and R1 are identical without requiring subsequent determination of the measurement of the sensor which corresponds to this situation. It will be noted that such a particular case simplifies the processing of the measurement results, but generally reduces the sensitivity of the detection device according to the invention.

In the case shown in FIG. 3, the measurement corresponding to $\alpha=\alpha_{ref}$ can be determined by electronic means known to those skilled in the art. One can cite, for example, the calculation of the middle point of the width at a characteristic height of the trough of curve 30, the determination of the greater value of two minimum values when there is an oscillation on curve 30 as is shown in FIG. 3, or the determination of the second passage through zero of the derivative of curve 30 using an electronic derivator device (also in the case in which an oscillation occurs). In the event that there is a peak, equivalent analyses can also be applied.

It is clear from the foregoing that the detection device is arranged to allow several successive measurements to be taken, in particular at a given desired frequency. Next, it includes a memory for storing a succession or successions of measurement results in an embodiment wherein the measurement curve for the detection of semi-axis R1 is similar to curve 30. Moreover, in this case, the temporal evolution of the rotation resulting from the control of the driving means for wheel 4 must be stored in an appropriate form to allow the instantaneous angular offset of semi-axis R1 relative to $\alpha_{ref}$ to be determined once the measurement result corresponding to the angular position a of semi-axis R1 equal to $\alpha_{ref}$ has been identified. Finally, if one wishes to know angular position a over a certain period of time, it is necessary to continue to follow said temporal evolution during such period of time.

In the conventional case in which the driving means for wheel 4 are formed by a stepping motor, counting of the steps can be easily achieved and each measurement can be stored with an addressing depending on the <<number>> of the step, in particular when a measurement is taken per step.

In the case of continuous driving, a temporal reference is necessary and the temporal evolution of angle $\alpha$ of semi-axis R1 can be deduced from the control of the synchronous motor rotatively driving wheel 4 (directly or indirectly via a gear train). Those skilled in the art can make electronic circuits accomplishing this function of following the rotation of wheel 4 and determining the instantaneous angular position of reference semi-axis R1. it will easily be understood that the particular case of direct detection of $\alpha=\alpha_{ref}$ simplifies the necessary electronic processing means.

In order to detect reference semi-axis R1 when the angular position of wheel 4 is lost or not known, an initialisation command is provided where the motor driving wheel 4 is controlled in a rapid mode and the detection device is activated so as to determine the angular position of semi-axis R1 during the passage thereof above or below coil 24 of sensor 20.

In order to check whether the position of semi-axis R1 is correct (during the working of the clockwork movement), the detection device is activated during the expected passage of this semi-axis R1 in the region of sensor 20. In the event of incorrect positioning, the motor control means correct the angular position of semi-axis R1. If it is not detected, the aforementioned initialisation mode is activated.

Figure 4:
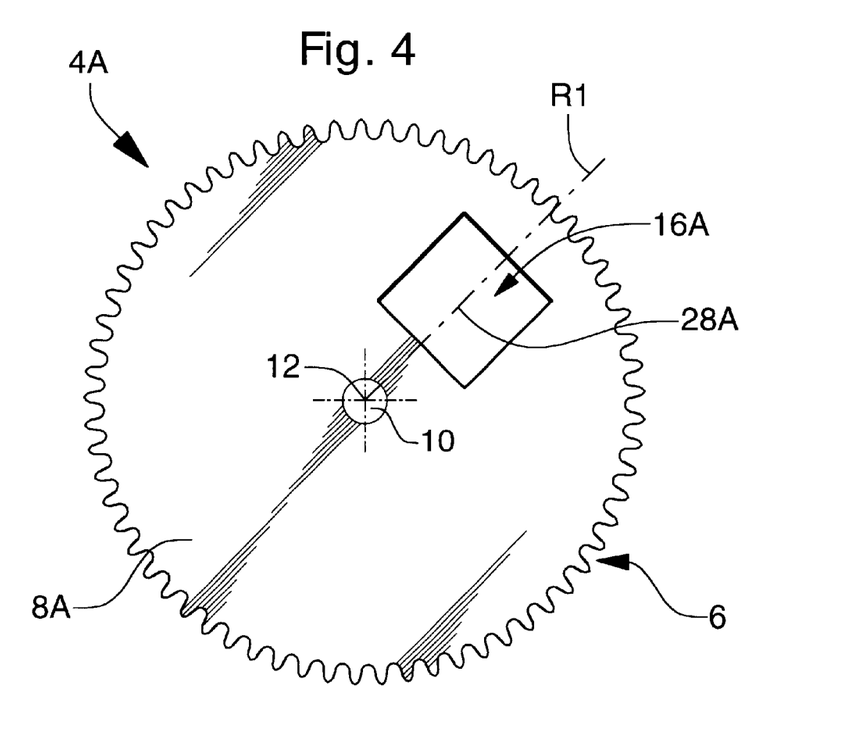
FIG. 4 shows schematically a variant of the wheel of FIG. 1.

FIG. 4 shows a wheel 4A having a plate 8A which has a square opening 16A. Reference semi-axis R1 passes through the geometric centre 28A of opening 16A. This wheel 4A forms an alternative embodiment of wheel 4 of FIG. 1.

Figure 5:
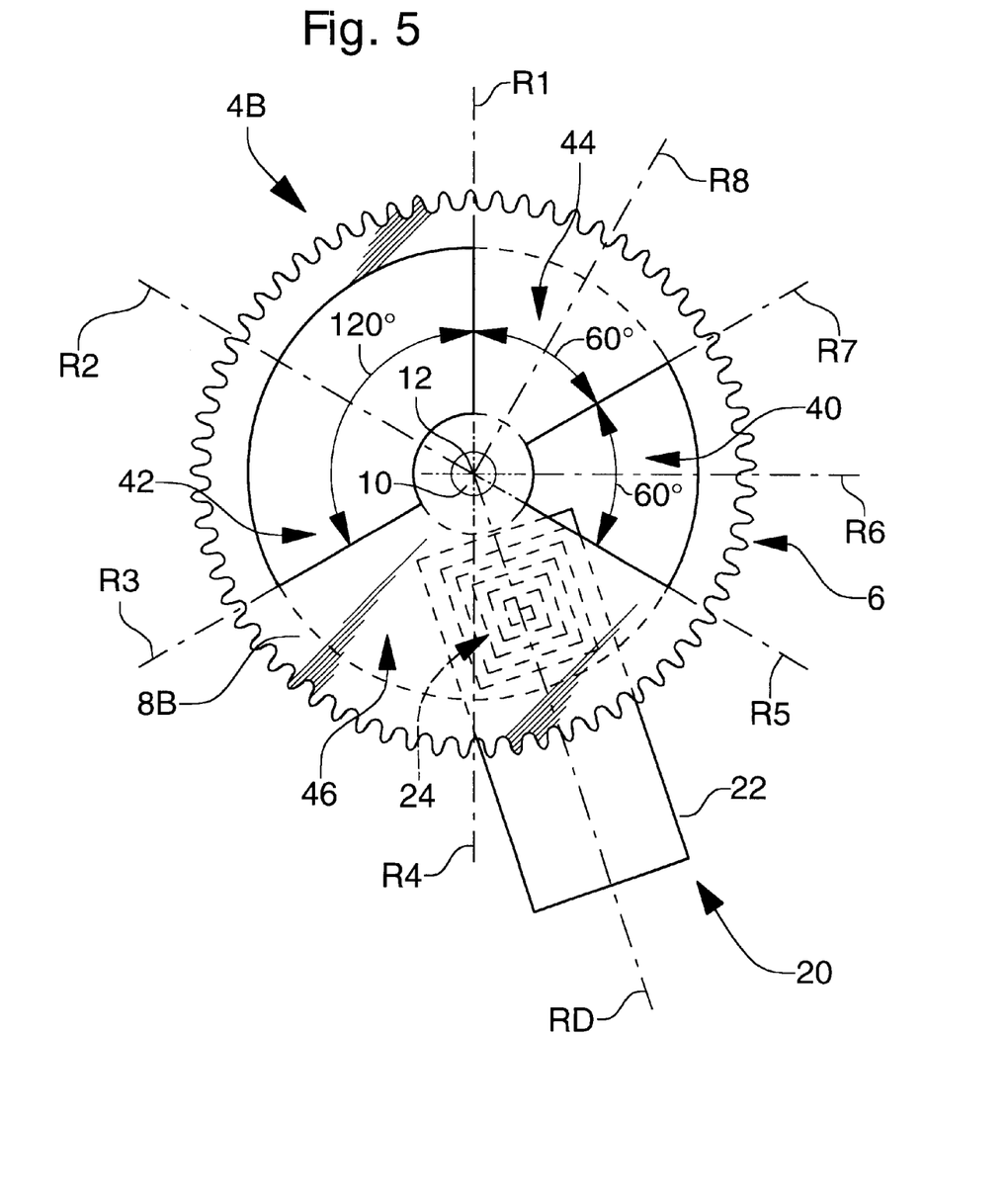
FIG. 5 shows schematically a particular embodiment of a toothed wheel associated with an inductive sensor according to the invention.

FIG. 5 shows schematically a second embodiment of a timepiece according to the invention in which sensor 20 is identical to that described in FIGS. 1 and 2. Wheel 4B associated with sensor 20 has two openings 40 and 42 in the shano, of an annular sector. Opening 40 defines an angle at centre of 60° while opening 42 defines an angle at centre of 120°. These two openings are situated in the intermediate region of plate 8B situated between the central hole provided for the passage of shaft 10 and toothing 6. The two openings 40 and 42 are separated from each other by two material portions 44 and 46 defining respectively angles at centre of 60° and 120°.

As was mentioned previously, the measurements taken repetitively during rotation of wheel 4B by sensor 20 allow the angular positions of reference semi-axes R2 and R6 of the wheel to be detected. The detection by sensor 20 of the angular positions of reference semi-axes R4 and R8, respectively identical to the median directions of annular portions 46 and 44, is effected in the same way as the detection of the angular positions of semi-axes R2 and R6. The passage above coil 24 of annular section 44 or 46 generates an increase in the frequency measured by the sensor, as is shown 30 in FIG. 6. When reference semi-axis R2 or R6 is substantially identical to semi-axis RD defined by sensor 20, the frequency measured by the sensor substantially corresponds to $F_{min}$, whereas the frequency measured has substantially the value $F_{max}$, when coil 24 is entirely covered by one of annular sections 44 or 46. Given that the resulting curve of the measurements taken by sensor 20 during the passage of a full or solid annular section defines a substantially symmetrical curve 48, the electronic means associated with the sensor allow the median position given by the vertical straight line 50, corresponding to angular position $\alpha_{ref}$, in the manner described hereinbefore with reference to FIGS. 1 to 3.

The configuration of plate 86 of wheel 48 shown in FIG. 5 allows four further reference semi-axes R1, R3, R5 and R7 of wheel 4B to be determined. As was already mentioned previously, sensor 20 is sensitive to a variation in the presence of the material forming plate 8B above or below coil 24. During the transition from a full or solid portion, i.e. one of annular sections 44 and 46, to an opening 40 or 42, the frequency of the measurement signal of sensor 20 passes from a value $F_{max}$ to a value $F_{min}$.

Figure 7:
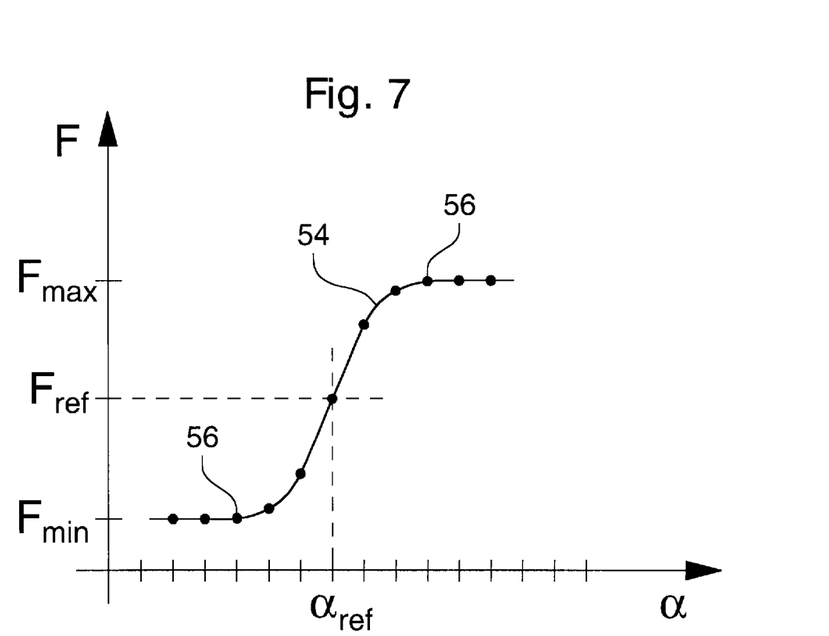
FIG. 7 shows a graph obtained from measurements taken by the inductive sensor of FIG. 5 during the passage from an opening to a full or solid portion above the inductive element formed by a flat spiral coil.

FIG. 7 shows the curve defined by the different measurement points obtained during a transition from an opening 40 or 42 to an arm or annular portion 44 or 46. Curve 54, defined by measurement points 56 passes progressively from frequency value $F_{min}$ to frequency value $F_{max}$ during an increase in angle α of semi-axis R3 or R7 in the event that wheel 4B rotates clockwise, or respectively of semi-axis R1 or R5 if wheel 4B rotates anticlockwise. It is possible to determine substantially the position $α=α_{ref}$ by determining the angle at which curve 54 corresponds to frequency $F_{ref}$ whose value is a middle value between $F_{min}$ and $F_{max}$. Thus, with the detection device provided in the present embodiment, it is possible to detect the edge of an opening when this edge defines a radial direction of the plate, as is the case in FIG. 5.

An annular sector defined by an opening or by a material portion in the intermediate region of the plate allows three reference semi-axes of the wheel including the plate to be defined. This is particularly clear from graph 48 shown in FIG. 6 which substantially corresponds to the passage of annular sector 44 above coil 24 of sensor 20. Analysis of graph 48 allows determination of which measurement point corresponds to the alignment of semi-axis R8 on reference semi-axis RD of the sensor and the measurement points corresponding to the alignment of semi-axis R7, or respectively R1 on semi-axis RD. These latter measurement points correspond respectively to angles α1 and α2 of FIG. 6 when wheel 46 rotates clockwise. The angular difference δα=α2−α1 is determined by the angular dimension of annular section 44 or 46 and, in the reverse situation, of the angular dimension of opening 40 or 42.

Thus, a measurement of δα allows determination of whether it is annular portion 44 or 46 which has passed above coil 24. Likewise, by measuring the width at midheight of a trough in an equivalent graph for the measurement points resulting from the passage of an opening 40 or 42 facing coil 24, it is possible to determine which of these openings has passed above coil 24. It follows from these considerations that the analysis of successive measurements by sensor 20 during rotation of wheel 4B allows the angular positions of each of reference semi-axes R1 to R8 to be determined in an univocal manner. Plate 8S thus defines six reference semi-axes which can be detected by sensor 20 which are staggered in relation to each other at an angle of 60°. Moreover, two reference semi-axes R6 and R8 can also be detected. Once the angular position of a semi-axis has been determined, the angular positions of the other semi-axes are also determined. As a general rule, a single reference semi-axis is sufficient to determine the angular position of a wheel in an initialisation mode and to check over time the correct forward movement of the wheel relative to a desired forward movement determined by the reference means.

Figure 8:
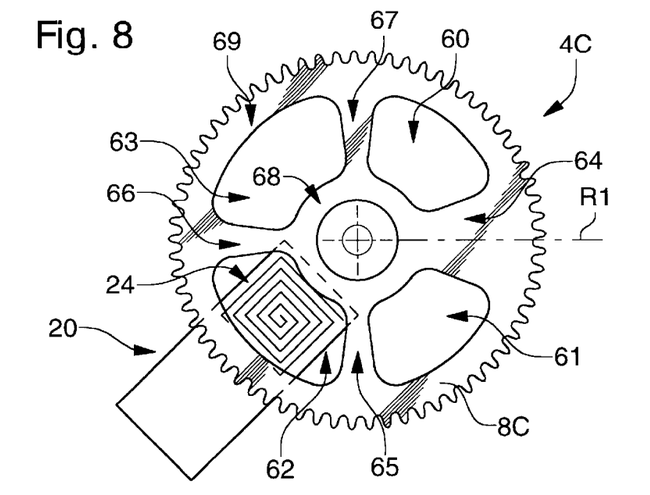
FIG. 8 shows schematically a particular embodiment of the invention.

FIG. 8 snows another embodiment of a wheel 4C associated with a detection device according to the invention. This detection device again includes a sensor 20 provided with a flat spiral coil 24. Plate 8C has four openings 60 to 63 defining four radial arms 64 to 67 linking hub 68 to wheel rim 69 of wheel 4C. Radial arm 64 has a greater radial dimension to the other three arms. The median line of this arm 64 defines the reference geometric semi-axis R1 of wheel 4C which is identical to this median line.

Figure 6:
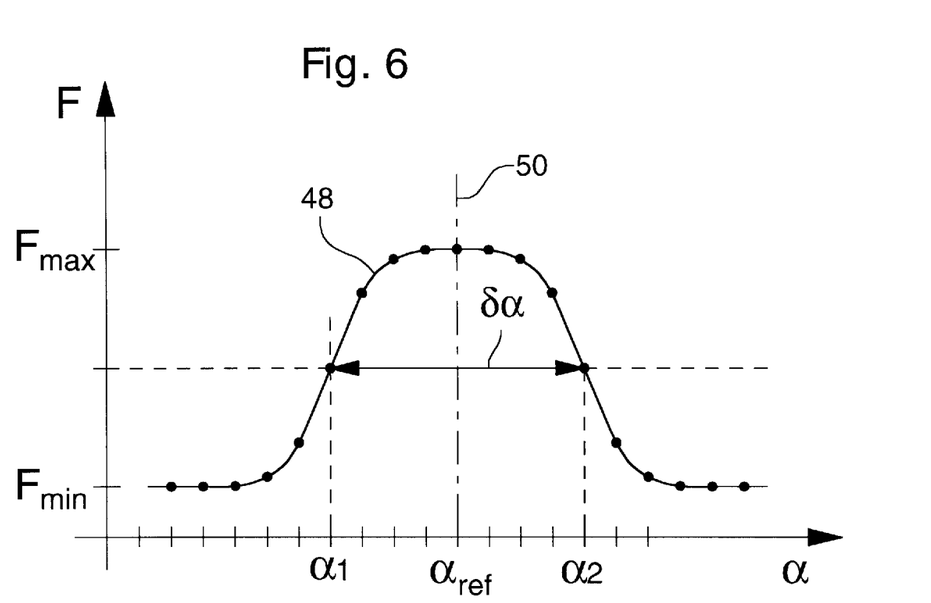
FIG. 6 shows a graph obtained from measurements taken by the inductive sensor of FIG. 5 the analysis of which allows the determination of at least one reference semi-axis of the wheel shown in said Figure.

Given the difference in angular dimension between arm 64 and the other arms, it is possible to determine the passage of this arm above coil 24, as was previously explained in relation to FIG. 6. Detection of the angular position of semi-axis R1 is identical to the determination of semi-axes R4 and R8 described in relation to FIGS. 5 and 6.

This embodiment is advantageous because plate 8C has openings distributed substantially uniformly so that the plate is substantially balanced. In order to balance plate 8C as well as possible, it is possible to increase the thickness of the material of arm 66 or, similarly, to reduce the quantity of material on the side of arm 64. It is also possible to reduce openings 63 and 64 slightly to obtain optimum balancing of plate 8C. Any other means known to those skilled in the art can be envisaged. In particular, it is also possible to provide a different arrangement of arms 65, 66 and 67. It is also possible to provide one arm less or more to obtain satisfactory balancing of plate 8C.

Figure 9:
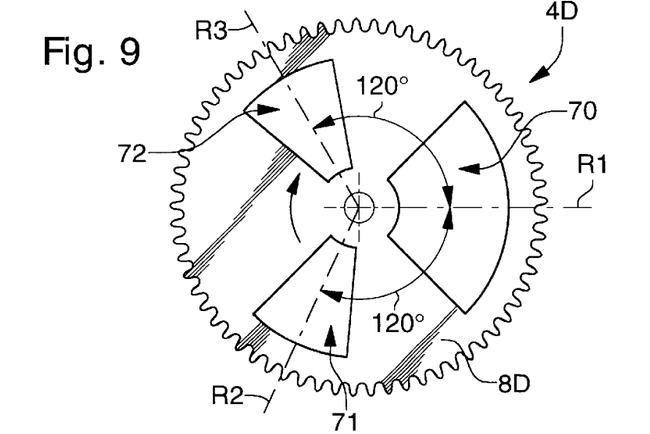
FIGS. 9 and 10 show schematically two variants of the wheel shown in FIG. 5 the arrangement of which allows detection of several reference semi-axes of the wheel.
Figure 10:
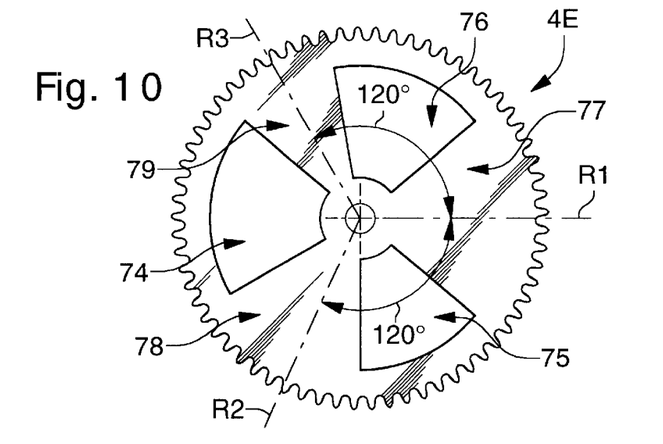

FIGS. 9 and 10 show two variants of another embodiment. Plate 8C of wheel 4D shown in FIG. 9 defines in particular three reference semi-axes R1, R2 and R3 which are staggered angularly at 120° and are respectively defined by the median straight lines of openings 70, 71 and 72. It will be noted that the angular dimension of opening 70 is greater than the respective angular dimensions of openings 71 and 72 which are identical. Although openings 71 and 72 are identical, they define however reference semi-axes R2 and R3 in a univocal manner, given that wheel 4D rotates in a determinate direction for example clockwise.

The variant shown in FIG. 10 shows a wheel 4E whose plate 8E also has three annular portions separated by three openings 74, 75 and 76. The three annular portions or radial arms 77, 78 and 79 each have a different specific radial dimension, namely 80°, 60° and 40°. Semi-axes R1, R2 and R3 are detected in a univocal manner whatever the direction of rotation of the wheel.

Figure 11:
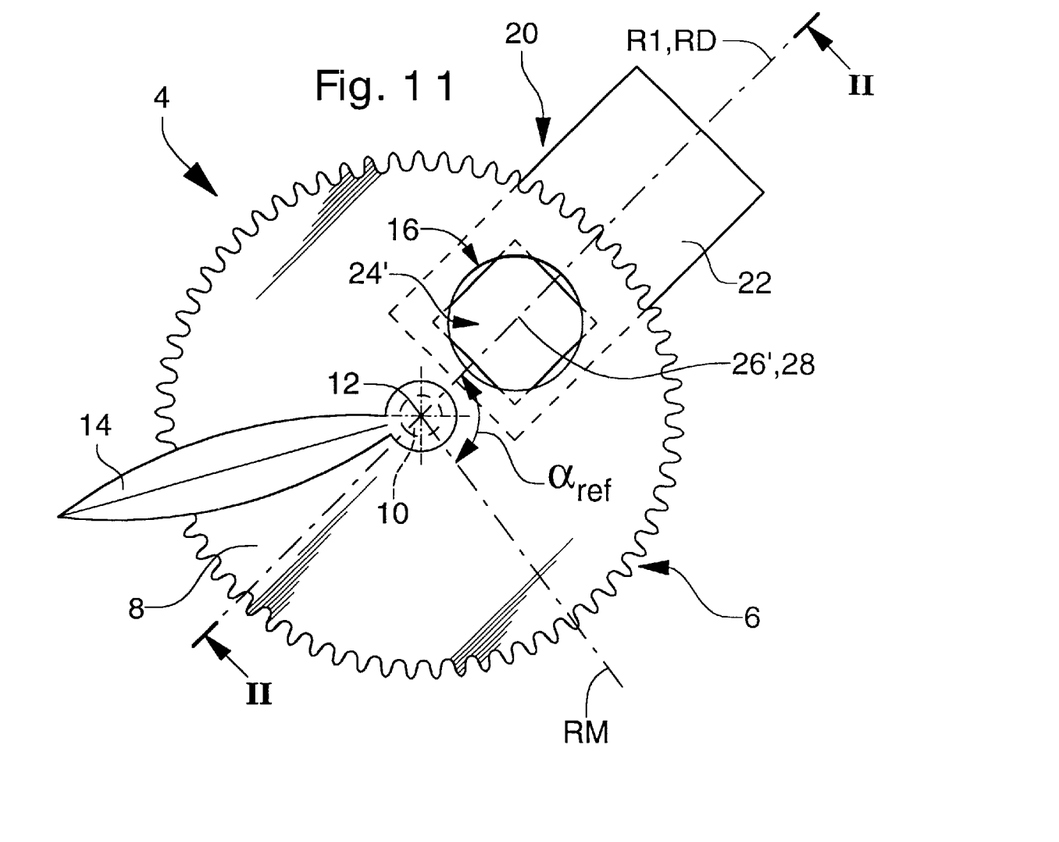
FIG. 11 is the same as FIG. 1 except that the inductive sensor is replaced by a gapacitive sensor.
Figure 12:
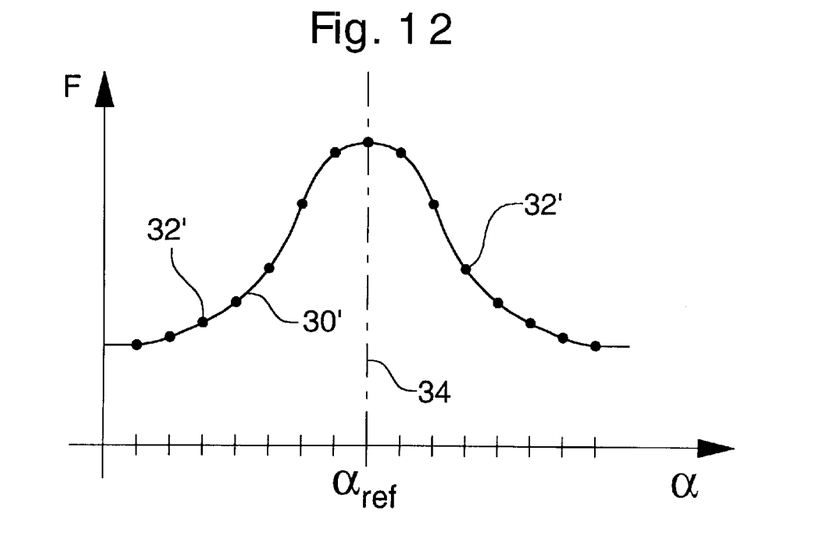
FIG. 12 is like FIG. 3, and shows a curve formed by using measurements taken by the capacitive sensor shown in FIG. 11.

FIG. 11 and 12 are like FIG. 1 and 3, respectively, but illustrate the embodiment wherein the sensor 20 is a capacitive sensor, instead of the magnetic or inductive sensor including the flat coil 24 illustrated in FIG. 1. In FIG. 11, the electrically conductive plate 24' replaces the flat coil 24 of FIG. 1. Plate 24' has a central geometric axis 26' and forms one of the plates of a variable capacitor, the other plate of which is formed by the wheel 4. Even though the plate 24' is illustrated as being square, such a shape is not necessary, as plate 24'; for example, may be circular. In regard to the position and area of a plate 24' with respect to those of the opening 16, they are the same as for the flat coil which is illustrated in FIG. 1 and whose magnetic axis 26 is replaced by the geometric axis 26' in FIG. 11 (see Applicant's specification at page 5, lines 5–13). The graph in FIG. 12 corresponds to that of FIG. 3, and includes the curve 30' defined by the measurement points 32' obtained by the capacitive sensor of FIG. 11.

What is claimed is:

1. A timepiece including:
   a clockwork movement provided with an analogue display and including one wheel fixed in rotation to a rotating analogue display means forming part of said analogue display, said wheel including a plate with a toothing defined by its external edge and a shaft perpendicular to said plate;
   a device for detecting the angular position of at least one reference geometric semi-axis of said wheel, said device including a magnetic sensor provided with a detection element;
   said plate of said wheel being formed by a material a variation in whose presence above or below the detection element of the sensor generates a variation in at least one parameter or one variable of said sensor on which a measuring signal provided by said sensor depends, said plate having at least one opening situated in the intermediate region thereof between a central hole, provided for the passage of said shaft, and said toothing, this opening being used to define said at least one reference geometric semi-axis, said sensor being arranged in relation to the wheel so that its detection element is at least partially above or below said opening in at least one given angular position of said wheel.

2. A timepiece according to claim 1, wherein said material constituting said plate is an electrically conductive metal.

3. A timepiece according to claim 2, wherein said metal has a magnetic permeability equal to 1 or close to 1.

4. A timepiece according to claim 3, wherein said metal is aluminum or brass.

5. A timepiece according to claim 1, wherein said detection element is formed by a single flat spiral coil, an electronic circuit of said sensor defining a differential relaxation oscillator, a variation in the presence of said material constituting said plate above or below said coil generating a variation in frequency of a signal generated by the sensor which results from a variation in the inductance value of said coil within said electronic circuit of said sensor.

6. A timepiece according to claim 1, wherein said at least one reference geometric semi-axis of said wheel starts perpendicular to the geometric axis of rotation of said shaft and passes through the geometric centre of said opening.

7. A timepiece according to claim 6, wherein said plate of said wheel has a plurality of openings situated in the intermediate region of said plate and at least one of which has a different angular dimension to the other openings, several openings defining respectively several reference geometric semi-axes of said wheel.

8. A timepiece according to claim 1, wherein said plate has in said intermediate region at least one material portion adjacent to said opening, the edge of said opening defined by said material portion defining said at least one reference geometric semi-axis of said wheel.

9. A timepiece according claim 1, wherein said plate has in its intermediate region at least said one opening and at least one radial arm whose median line defines said at least one reference geometric semi-axis of said wheel which is identical to said median line.

10. A timepiece according to claim 9, wherein a plurality of radial arms are provided separated by a corresponding plurality of openings and situated in said intermediate region, said plurality of arms materially linking a hub and the wheel rim of said wheel, at least one of said arms having a different angular dimension from that of the other arms and defining said reference geometric semi-axis.

11. A timepiece according to claim 10, wherein the median lines of several of said radial arms define respectively several reference geometric semi-axes of said wheel.

12. A timepiece comprising:

a clockwork movement provided with an analogue display and including one wheel fixed in rotation to a rotating analogue display means forming part of said analogue display, said wheel including a plate with a toothing defined by its external edge and a shaft perpendicular to said plate; and a device for detecting the angular position of at least one reference geometric semi-axis of said wheel, said device including a capacitive sensor provided with a detection element;

said plate of said wheel being formed by a material a variation in whose presence above or below the detection element of the sensor generates a variation in at least one parameter or one variable of said sensor on which a measuring signal provided by said sensor depends, said plate having at least one opening situated in an intermediate region thereof between a central hole, provided for the passage of said shaft, and said toothing, said opening being used to define said at least one reference geometric semi-axis, and said sensor being arranged in relation to the wheel so that said detection element is at least partially above or below said opening in at least one given angular position of said wheel.

* * * * *